(12) United States Patent
Hsiao

(10) Patent No.: US 9,018,967 B2
(45) Date of Patent: Apr. 28, 2015

(54) ELECTRICAL PROBE FOR TESTING ELECTRONIC DEVICE

(71) Applicant: Te-Hsing Hsiao, Changhua County (TW)

(72) Inventor: Te-Hsing Hsiao, Changhua County (TW)

(*) Notice: Subject to any disclaimer, the term of this patent is extended or adjusted under 35 U.S.C. 154(b) by 70 days.

(21) Appl. No.: 13/951,477

(22) Filed: Jul. 26, 2013

(65) Prior Publication Data

US 2014/0320158 A1 Oct. 30, 2014

(30) Foreign Application Priority Data

Apr. 26, 2013 (TW) .............................. 102207666 U

(51) Int. Cl.
*G01R 1/067* (2006.01)

(52) U.S. Cl.
CPC ........ *G01R 1/06738* (2013.01); *G01R 1/06722* (2013.01)

(58) Field of Classification Search
CPC .. G01R 1/06722; G01R 3/00; G01R 1/07378; G01R 31/2889; G01R 1/07342
USPC ........................ 324/754.02–754.14
See application file for complete search history.

(56) References Cited

U.S. PATENT DOCUMENTS

| | | | | |
|---|---|---|---|---|
| 3,566,122 | A * | 2/1971 | Paine et al. | 250/336.1 |
| 4,468,615 | A * | 8/1984 | Jamet et al. | 324/755.11 |
| 6,208,155 | B1 * | 3/2001 | Barabi et al. | 324/750.25 |
| 7,057,403 | B2 * | 6/2006 | Kazama | 324/755.05 |
| 7,154,286 | B1 * | 12/2006 | Marx et al. | 324/755.05 |
| 7,453,278 | B2 * | 11/2008 | Leon | 324/750.11 |
| 8,087,956 | B2 * | 1/2012 | Nakayama | 439/700 |
| 8,836,362 | B2 * | 9/2014 | Hasegawa | 324/755.01 |
| 2002/0043983 | A1 * | 4/2002 | Cheng | 324/755 |
| 2004/0012402 | A1 * | 1/2004 | Sinclair | 324/754 |
| 2006/0238208 | A1 * | 10/2006 | Leon | 324/754 |
| 2007/0257687 | A1 * | 11/2007 | Leon | 324/754 |
| 2009/0096473 | A1 * | 4/2009 | Tsai et al. | 324/757 |
| 2014/0179031 | A1 * | 6/2014 | Preston et al. | 438/15 |

* cited by examiner

*Primary Examiner* — Tung X Nguyen
*Assistant Examiner* — Alesa Allgood
(74) *Attorney, Agent, or Firm* — Leong C. Lei

(57) ABSTRACT

An electrical probe comprises a cylindrical body which has a first end including a plurality of claws and a second end opposite to the first end for cooperating with an electrical test machine, wherein a concave contact surface conforming with the curvature of a solder ball of an electronic device under test is formed between the claws, whereby the first end of the cylindrical body can be brought into line contact with the solder ball at a predetermined length to ensure a proper electrical connection, so that the accuracy of an electrical test can be increased.

2 Claims, 5 Drawing Sheets

ELECTRICAL PROBE FOR TESTING ELECTRONIC DEVICE

TECHNICAL FIELD OF THE INVENTION

The present invention relates to an electrical probe for testing an electronic device and, more particularly, to an electrical probe that includes a plurality of claws, between which a concave contact surface conforming with the curvature of the solder ball of the electronic device is formed, whereby the contact area between the electrical probe and the solder ball can be increased.

DESCRIPTION OF THE PRIOR ART

Microprocessors, which are a typical example of an integrated circuit, are usually fabricated in BGA (Ball Grid Array) package, which connects to a PCB (printed circuit board) via solder balls. For ensuring an electronic package to be correctly fabricated, electrical tests are required.

Conventionally, for conducting an electrical test for an electronic device, tapered probes can be employed to touch the solder balls of the electronic device. However, in the test, since each tapered probe is in point contact with each solder ball, the tapered probes may not keep a proper election connection with the solder balls, and thus an inaccurate test may result.

For mitigating the disadvantage of the conventional probes, there are two Taiwan's Utility Model Patents, including M429101 and M427570, have been disclosed, which employ a multi-point probe to increase the contact area between each probe and each solder ball for improving the electrical connection therebetween.

As to those disclosures, since each probe is very thin, the number of contact points that can be formed on each probe is very limited, which is usually less than 5. Thus, the improvement of the electrical connection is limited. Besides, when two objects are electrically connected through point contact, high voltage is prone to occur, and thus may cause an electromagnetic interference to the associated electrical test.

In view of the foregoing, applicant has contrived an electrical probe for testing an electronic device of BGA package, which can significantly increase the contact area between it and the solder ball of the electronic device to ensure a proper electrical connection.

SUMMARY OF THE INVENTION

The primary object of the present invention is to provide an electrical probe, which comprises a cylindrical body which has a first end including a plurality of claws and a second end opposite to the first end for cooperating with an electrical test machine, wherein a concave contact surface conforming with the curvature of a solder ball of an electronic device under test is formed between the claws, whereby the first end of the cylindrical body can be brought into line contact with the solder ball at a predetermined length to ensure a proper electrical connection for increasing the test accuracy.

According to one aspect of the present invention, the number of the claws can be more than two.

According to a further aspect of the present invention, a cylindrical cutter having a length more than the diameter of the cylindrical body and having a diameter substantially equal to the solder ball, can be placed above the first end of the cylindrical body and operated to move in a direction substantially perpendicular to the cylindrical body. With the cylindrical cutter, an intersection between the cylindrical cutter and the cylindrical body can be removed from the first end of the cylindrical body. As a result, two claws can be formed at the first end of the cylindrical body and one concave contact surface can be formed between the two claws, wherein the tip of each claw is located at the circumference of the cylindrical body. The method of forming the concave contact surface at the first end of the cylindrical body is not limited to using the cylindrical cutter, other methods are also possible.

According to a still further aspect of the present invention, the second end of the cylindrical body can be slidably inserted into a sleeve containing therein a first spring which urges against the second end of the cylindrical body, so that the electrical probe can be elastically urged against a corresponding solder ball of the electronic device under test; the sleeve can be disposed within a hole of a fixture in the electrical test machine, the second end of the cylindrical body is further provided with a flange having a dimension greater than the sleeve; a second spring is disposed within the hole of the fixture and fitted around the sleeve, and thus the second spring can urge against the flange of the cylindrical body to provide additional elasticity for the electrical probe, which allows the electrical probe to be urged against the solder ball of the electronic device under test more firmly, thereby ensuring a good electrical connection, which in turn increases the accuracy of the electrical test.

According to a still further aspect of the present invention, since the first end of the cylindrical body is shaped to have a concave cylindrical surface conforming with the curvature of the solder ball of the electronic device under test, in a testing application, the electrical probe can be brought into line contact with the solder ball at a predetermined length, which can significantly increase the contact area between the electrical probe and the solder ball, thereby ensuring a proper electrical connection and thus increasing the accuracy of the electrical test.

According to a still further aspect of the present invention, since the electrical probe is brought into line contact with the solder ball rather than point contact, high electrical voltage between the electrical probe and the solder ball can be prevented, so that the electromagnetic interference can be avoided and thus the results of the electrical test will become more accurate.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
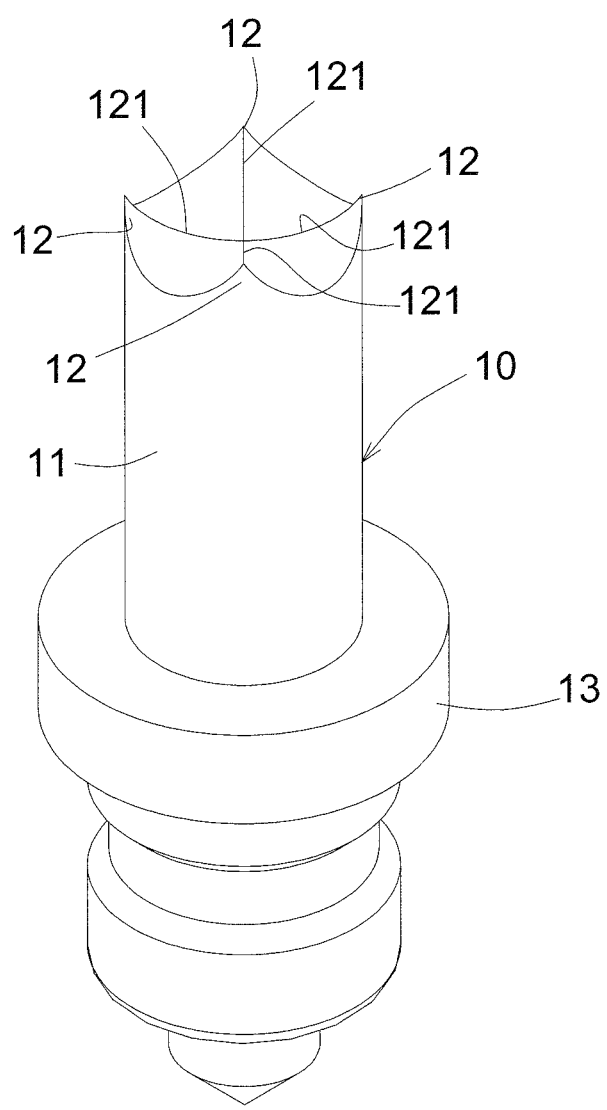
FIG. 1 shows a 3-dimensional view of one embodiment of the present invention.
Figure 2:
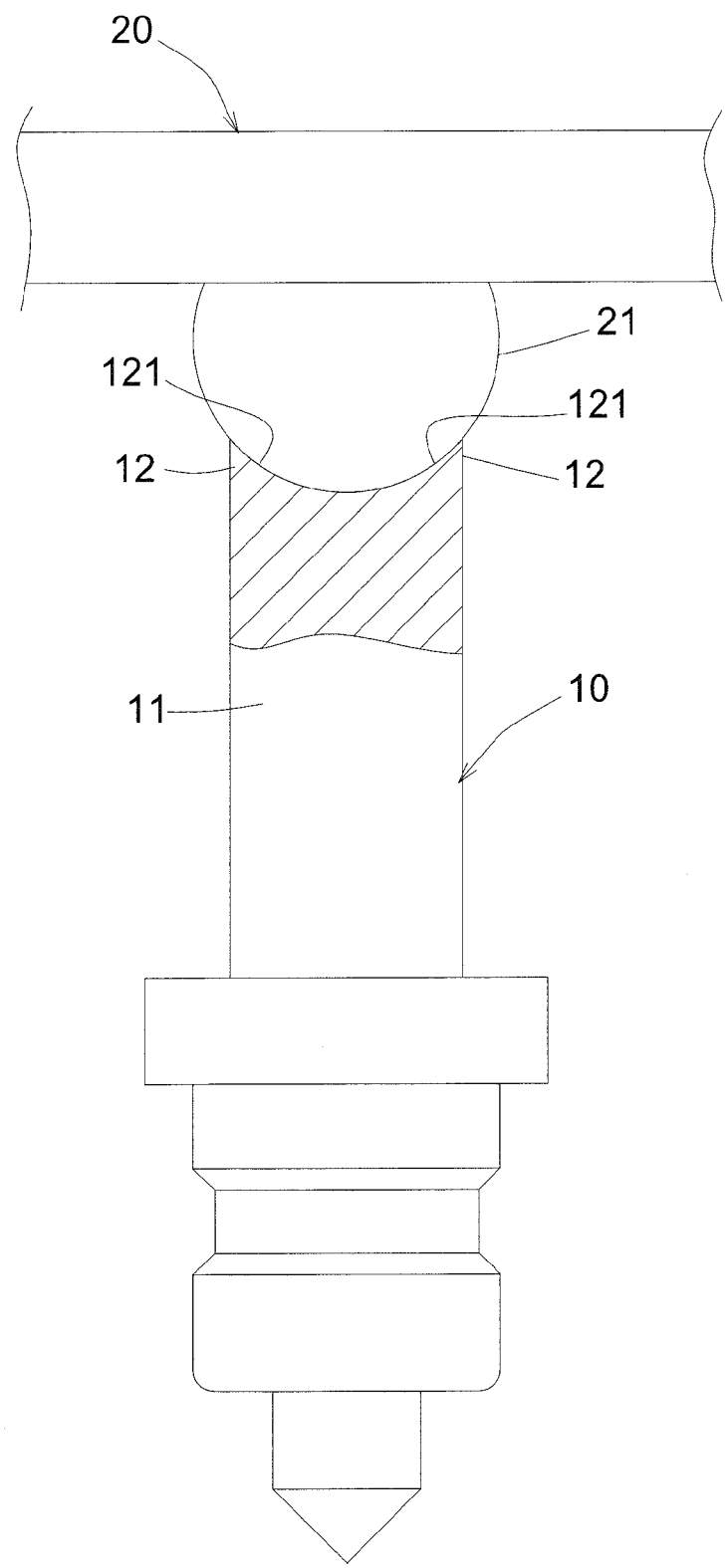
FIG. 2 shows a schematic view of one embodiment of the present invention, wherein the electrical probe is brought into line contact with a solder ball of an electronic device under test.

FIGS. 1 and 2 show embodiments, concerning an electrical probe (10), of the present invention, which generally comprise a cylindrical body (11) which has a first end including a plurality of claws (12) and a second end opposite to the first end for cooperating with a test machine. Furthermore, a concave contact surface (121), conforming with the curvature of a solder ball (21) of an electronic device under test (20), is defined between two adjacent claws (12). With these features, the contact area between the cylindrical body (11) and the solder ball (21) can be increased, and thus the test accuracy can be increased.

Although the accompanying drawings of the present invention show a specific number of claws (12), the electrical probe (10) can have other number of claws.

Figure 3:
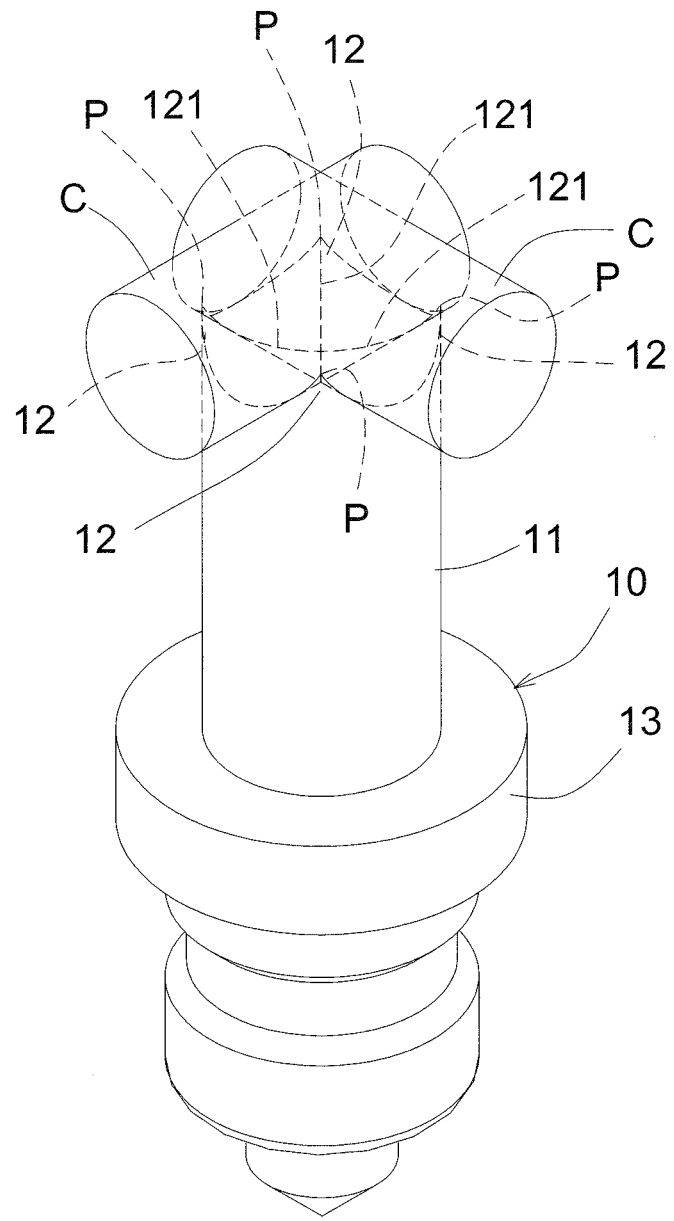
FIG. 3 shows a schematic view of the present invention, which illustrates a way of shaping the electrical probe.

In manufacturing the electrical probe of the present invention, as shown in FIG. 3, a cylindrical cutter (C) having a length more than the diameter of the cylindrical body (11) and having a diameter substantially equal to the solder ball (21), can be placed above the first end of the cylindrical body (11) and operated to move in a direction substantially perpendicular to the cylindrical body (11). With the cylindrical cutter (C), an intersection between the cylindrical cutter (C) and the cylindrical body (11) can be removed from the first end of the cylindrical body (11). As a result, the intersection being removed can be substantially perpendicular to the cylindrical body (11), and two claws (12) can be formed at the first end of the cylindrical body (11) and one concave contact surface (121) can be formed between the two claws (12), wherein the tip of each claw (12) is located at the circumference of the cylindrical body (11) and indicated by reference numeral (P). To have more number of claws, additional cut, being angularly offset from the previous cut, can be performed at the top end of the cylindrical body (11). The method of forming the concave contact surface (121) at the first end of the cylindrical body (11) is not limited to using the cylindrical cutter, other methods are also possible.

Figure 4:
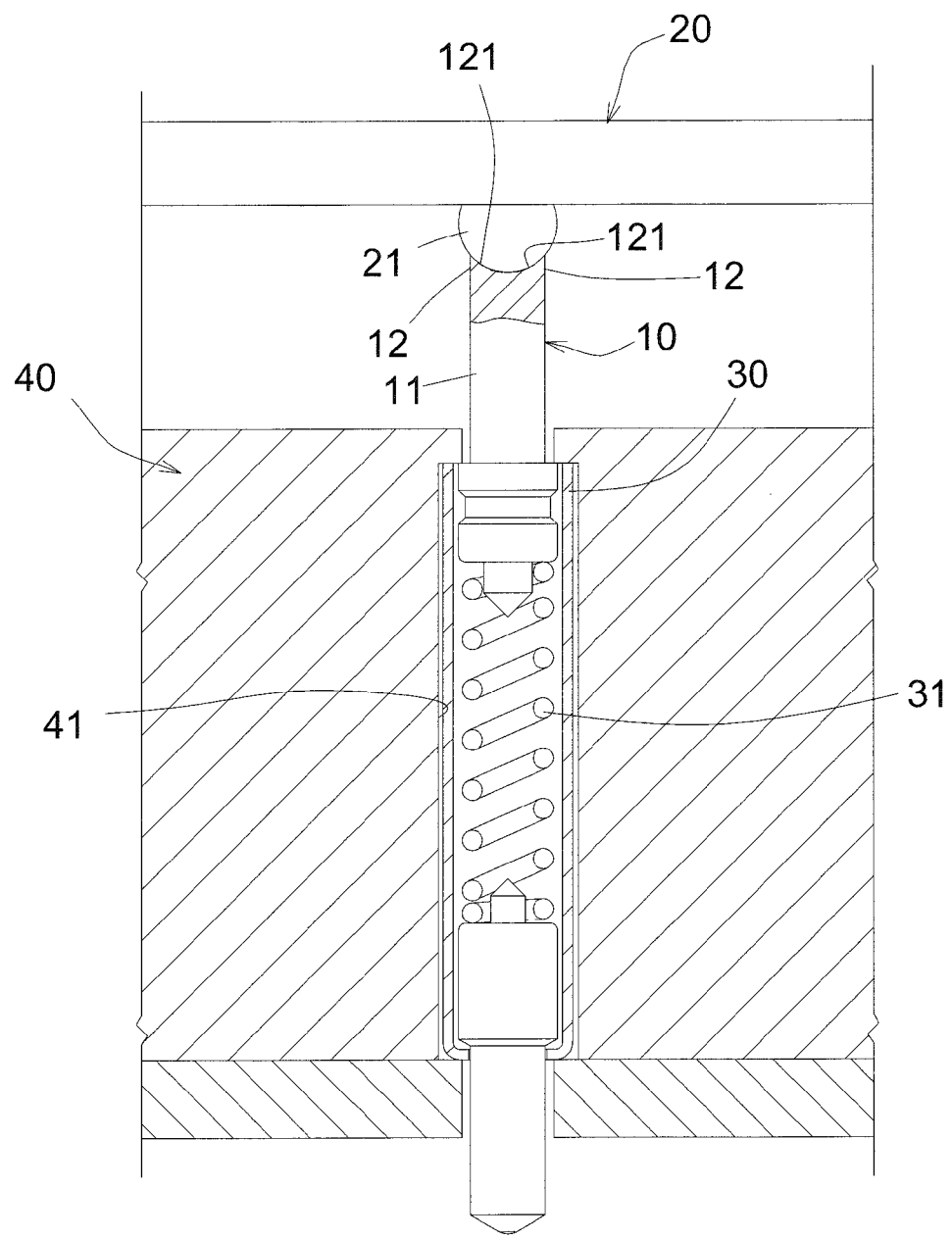
FIG. 4 shows an application view of the present invention, wherein the electrical probe cooperates with a fixture of a type in an electrical test machine.
Figure 5:
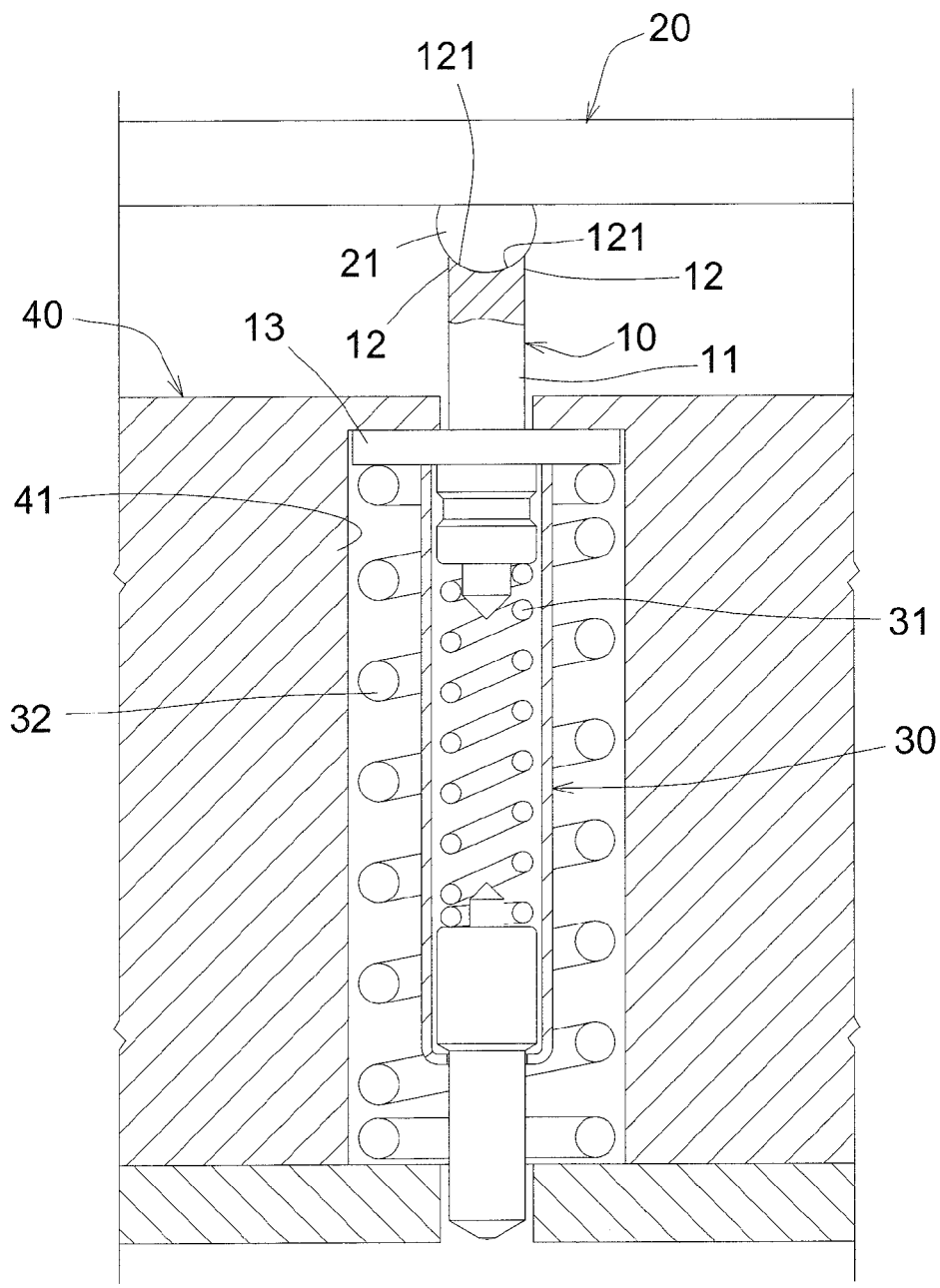
FIG. 5 shows another application view of the present invention, wherein the electrical probe cooperates with a fixture of another type in an electrical test machine.

FIG. 4 shows that the electrical probe (10) can be applied in an electrical test machine for testing an electronic device. As shown, the second end of the electrical probe (10) can be slidably inserted into a sleeve (30) containing therein a first spring (31) which urges against the second end of the cylindrical body (11), so that the electrical probe (10) can be elastically urged against a solder ball (21) of the electronic device under test (20). In a testing application, the sleeve (30) can be disposed within a hole (41) of a fixture (40) in the electrical test machine. Furthermore, as shown in FIG. 5, the second end of the cylindrical body (11) can be provided with a flange (13) having a dimension greater than the sleeve (30), and a second spring (32) can be disposed within the hole (41) of the fixture (40) and fitted around the sleeve (30), and thus the second spring (32) can urge against the flange (13) of the cylindrical body (11) to provide additional elasticity for the electrical probe (10), which allows the electrical probe (10) to be urged against the solder ball (21) of the electronic device under test (20) more firmly, thereby ensuring a good electrical connection, which in turn increases the accuracy of the electrical test.

Since the first end of the cylindrical body (11) is shaped to have a concave cylindrical surface (121) conforming with the curvature of the solder ball (21) of the electronic device under test (20), in a testing application, the electrical probe (10) can be brought into line contact with the solder ball (21) at a predetermined length, which can significantly increase the contact area between the electrical probe (10) and the solder ball (21), thereby ensuring a proper electrical connection and thus increasing the accuracy of the electrical test.

Furthermore, since the electrical probe (10) is brought into line contact with the solder ball (21) rather than point contact, high electrical voltage between the electrical probe (10) and the solder ball (21) can be prevented, so that the electromagnetic interference can be avoided and thus the results of the electrical test will be become more accurate.

Although the present invention has been described with a certain degree of particularity, it is understood that the present disclosure is made by way of example only and the combination and arrangement of parts may be resorted to without departing from the spirit and scope of the invention hereinafter claimed.

I claim:

1. An electrical probe comprising a cylindrical body which has a first end including a plurality of claws and a second end opposite to the first end, wherein a concave contact surface conforming with the curvature of a solder ball of an electronic device under test is formed between the claws, the first end of the cylindrical body is brought into line contact with the solder ball at a predetermined length to ensure a proper electrical connection, the second end of the cylindrical body is slidably inserted into a sleeve containing therein a first spring which urges against the second end of the cylindrical body, so that the electrical probe is elastically urged against a corresponding solder ball of the electronic device under test, and wherein the sleeve is disposed within a hole of a fixture, the second end of the cylindrical body is further provided with a flange having a dimension greater than the sleeve, and a second spring is disposed within the hole of the fixture and fitted around the sleeve, and thus the second spring can urge against the flange of the cylindrical body to provide additional elasticity for the electrical probe.

2. The electrical probe of claim 1, wherein the concave contact surface of the cylindrical body is formed by using a cylindrical cutter, having a diameter substantially equal to the solder ball, placed above the first end of the cylindrical body to remove an intersection between the cylindrical cutter and the first end of the cylindrical body, wherein the intersection being removed is substantially perpendicular to the cylindrical body.

* * * * *